(12) United States Patent
Benzie et al.

(10) Patent No.: US 11,038,147 B2
(45) Date of Patent: Jun. 15, 2021

(54) ELECTROLUMINESCENCE DEVICE

(71) Applicant: Sumitomo Chemical Company Limited, Tokyo (JP)

(72) Inventors: Philip Benzie, Godmanchester (GB); Mark Herrington, Godmanchester (GB); Karen Alsop-Fox, Godmanchester (GB)

(73) Assignee: Sumitomo Chemical Company Limited, Tokyo (JP)

( * ) Notice: Subject to any disclaimer, the term of this patent is extended or adjusted under 35 U.S.C. 154(b) by 235 days.

(21) Appl. No.: 16/097,605

(22) PCT Filed: Apr. 26, 2017

(86) PCT No.: PCT/GB2017/051158
§ 371 (c)(1),
(2) Date: Oct. 29, 2018

(87) PCT Pub. No.: WO2017/187166
PCT Pub. Date: Nov. 2, 2017

(65) Prior Publication Data
US 2020/0328380 A1 Oct. 15, 2020

(30) Foreign Application Priority Data
Apr. 29, 2016 (GB) .................................. 1607457

(51) Int. Cl.
*H01L 51/52* (2006.01)
*H01L 51/00* (2006.01)
(Continued)

(52) U.S. Cl.
CPC ...... *H01L 51/5262* (2013.01); *H01L 51/0003* (2013.01); *H01L 51/5056* (2013.01);
(Continued)

(58) Field of Classification Search
CPC combination set(s) only.
See application file for complete search history.

(56) References Cited

U.S. PATENT DOCUMENTS

2005/0274944 A1 12/2005 Jang et al.
2007/0069199 A1 3/2007 Choulis et al.
(Continued)

FOREIGN PATENT DOCUMENTS

KR 10-2011-0011202 A 2/2011
KR 10-2013-0097138 A 9/2013
(Continued)

OTHER PUBLICATIONS

PCT/GB2017/051158, Oct. 25, 2017, International Search Report and Written Opinion.
(Continued)

*Primary Examiner* — Mamadou L Diallo
(74) *Attorney, Agent, or Firm* — Wolf, Greenfield & Sacks, P.C.

(57) ABSTRACT

The present disclosure relates to an organic electroluminescence device with enhanced out-coupling efficiency. The electroluminescence device comprises a substrate, a first electrode disposed on the substrate, an organic layer and a second electrode. The organic layer is formed between the first electrode and the second electrode. The organic layer comprises one or more nanoparticles forming protrusion features on the organic layer thereby forming a topographical structured organic layer in the electroluminescence device. The electroluminescence device is capable of reducing the surface plasmon polariton loss thereby, enhancing the light out-coupling the electroluminescence device.

14 Claims, 3 Drawing Sheets

(51) Int. Cl.
  *H01L 51/50* (2006.01)
  *H01L 51/56* (2006.01)
(52) U.S. Cl.
  CPC ...... *H01L 51/5072* (2013.01); *H01L 51/5088* (2013.01); *H01L 51/56* (2013.01); *H01L 2251/5369* (2013.01); *H01L 2251/558* (2013.01)

(56) References Cited

U.S. PATENT DOCUMENTS

| | | | |
|---|---|---|---|
| 2007/0290604 A1 | 12/2007 | Sakanoue et al. | |
| 2011/0045392 A1 | 2/2011 | Lemmer et al. | |
| 2011/0059867 A1* | 3/2011 | Kim | C40B 80/00 506/16 |
| 2011/0204773 A1* | 8/2011 | Yasuda | H05B 33/24 313/504 |
| 2014/0027753 A1 | 1/2014 | Yamana et al. | |
| 2014/0061591 A1* | 3/2014 | Chichak | H01L 51/5088 257/40 |
| 2014/0332794 A1 | 11/2014 | Birnstock et al. | |
| 2016/0362601 A1* | 12/2016 | Ackermann | C09K 11/025 |
| 2017/0324057 A1* | 11/2017 | Friend | H01L 51/502 |

FOREIGN PATENT DOCUMENTS

| | | |
|---|---|---|
| WO | WO 2010/104183 A1 | 9/2010 |
| WO | WO 2012/029750 A1 | 3/2012 |
| WO | WO 2013/068842 A1 | 5/2013 |
| WO | WO 2013/083712 A1 | 6/2013 |

OTHER PUBLICATIONS

GB1607457.7, Oct. 12, 2016, Combined Search and Examination Report.
International Search Report and Written Opinion for International Application No. PCT/GB2017/051158, dated Oct. 25, 2017.
Combined Oct. 12, Search and Examination Report for British Application No. GB1607457.7, dated Oct. 12, 2016.
Korean office action dated Jan. 29, 2021 in connection with Korean Application No. 20187034428.

* cited by examiner

ELECTROLUMINESCENCE DEVICE

RELATED APPLICATIONS

This Application is a national stage filing under 35 U.S.C. § 371 of international PCT application PCT/GB2017/051158, filed Apr. 26, 2017, which claims priority to United Kingdom patent application GB 1607457.7, filed Apr. 29, 2016, each of which is incorporated herein by reference in its entirety.

The present invention relates to an electroluminescence device, and in particular, to an organic electroluminescence device with reduced surface plasmon polariton loss.

BACKGROUND

An electroluminescence device corresponds to an electronic device that emits light on application of electrical field on the electronic device. Various examples of the electroluminescence device may include, but are not limited to, light emitting diodes (LEDs), and organic LEDs (OLEDs).

Of the aforementioned types of electroluminescence device, OLED has recently drawn attention of the researchers due to various factors such as low driving voltage, fast response time, and flexibility. Typically OLED comprises a substrate, an anode, a cathode and organic layers between the cathode and the anode. The holes generated by the anode and the electrons generated by the cathode, recombine in the organic layers to generate photons. Usually, photons are generated when the holes present in the highest occupied molecular orbit (HOMO) combine with the electrons present in the least occupied molecular orbit (LUMO) in the organic layers.

Due to a phenomenon such as, but not limited to, surface plasmon polariton (SPP), 75% of the photons may get trapped in the OLED, which in turn affects the out-coupling efficiency of the OLED. The SPP corresponds to a phenomenon when the photons generated in the organic layers interact with the surface electrons of the cathode layer and cause the surface electrons to oscillate. In the process, the photons may lose their energy, and thus reducing the out-coupling efficiency of the OLED.

U.S. Pat. No. 8,969,856B2 discloses an optoelectronic device that comprises a hole injecting layer. The hole injecting layer comprises an organic matrix that includes inorganic nanoparticles. The concentration of the inorganic nanoparticles in the hole injecting layer is in the range from 5% to 50% by weight.

US20120132897A1 discloses an organic EL element including a diffraction grating. The diffraction grating comprises a transparent substrate and a cured resin layer formed on the substrate. The cured resin layer has concavities and convexities which are introduced using a master block. The master block is formed by deposition of block co-polymer solution.

U.S. Pat. No. 7,589,463B2 discloses a top emitting OLED including a bottom electrode arranged on the substrate. The bottom electrode comprises grooved surface (corrugated structure). A surface of the bottom electrode, facing the stack of organic layers, is formed in a way to reflect light at least in a partial region.

U.S. Pat. No. 8,022,619B2 discloses a design of top-emitting OLED including an additional layer on the side of second electrode. The additional layer, also termed as decoupling layer, includes optically effective heterogeneities as scatter centers. The size of scatter particles is in a range of 50 nm to 100 μm.

US2014/332794 discloses the use of elongate nanoparticles in an EiL.

SUMMARY OF THE INVENTION

An electroluminescence device is provided as specified in claim 1. The electroluminescence device comprises a substrate, a first electrode disposed on the substrate, a second electrode, and an organic layer disposed between the first electrode and the second electrode. A composition of the organic layer comprises one or more nanoparticles such that a density of the one or more nanoparticles in the organic layer is less than 7 nanoparticles/$\mu m^2$. The one or more nanoparticles forms a bulge section on the organic layer, and the second electrode is disposed on at least the bulge section.

In accordance with an embodiment, the bulge section comprises a portion of the one or more nanoparticles protruding out from the organic layer. In accordance with an embodiment, the organic layer disposed between the first electrode and the second electrode comprises a hole injection layer, a hole transport layer, an emissive layer and an electron transport layer. In accordance with an embodiment, the electron transport layer includes the one or more nanoparticles.

In accordance with an embodiment, the one or more nanoparticles are dispersed in a solution to form a final solution. The solution includes an organic material and a solvent. In accordance with an embodiment, a weight percentage of the one or more nanoparticles is less than 0.5% in the final solution.

In accordance with an embodiment, the final solution is deposited on the first electrode to form the organic layer using techniques such as spin coating, screen printing, slot die coating and inkjet printing. Further, in accordance with an embodiment, materials of the organic layer may be selected from a group consisting of, but not limited to, MEH-PPV, PFO, P-PPV, oligoquinolines, conjugated polyelectrolyte poly[9,9-bis(3'-(N,N-dimethylamino)propyl)-2,7-fluorene)-alt-2,7-(9,9-dioctylfluorene)], 4,7-diphenyl-1,10-phenanthroline, 1,3,5-tri(3-pyrid-3-yl-phenyl)benzene or diphenylphosphine oxide derivative.

In accordance with an embodiment, a diameter of each of the one or more nanoparticles is in a range from 60 nm to 150 nm. Further, in accordance with an embodiment, a thickness of the organic layer is in a range from 10 nm to 120 nm. Further, in accordance with an embodiment, the one or more nanoparticles are composed of optically transparent and electrically insulating materials.

In accordance with an embodiment, the diameter of the one or more nanoparticles is greater than the thickness of the organic layer.

In accordance with an embodiment, the diameter of the one or more nanoparticles is less than the thickness of the organic layer. The one or more nanoparticles are phase separated to the top of the organic layer during disposition of the organic layer on the first electrode. In accordance with an embodiment, a height of the bulge section on the organic layer is in a range from 50 nm to 200 nm.

In accordance with an embodiment, the first electrode corresponds to an anode of the electroluminescence device. Further, in accordance with an embodiment, the second electrode corresponds to a cathode of the electroluminescence device.

In accordance with an embodiment, the substrate of the electroluminescence device corresponds to a transparent substrate.

In accordance with an embodiment, a composition of an organic layer of an electroluminescence device is provided as specified in the independent claim 22. In accordance with an embodiment, the composition includes a solvent, an organic material and plurality of nanoparticles. In accordance with an embodiment, a solution is formed by dissolving the organic material into the solvent. Further, a final solution is formed by dispersing the plurality of nanoparticles in the solution. In accordance with an embodiment, the weight percentage of the plurality of nanoparticles in the final solution is less than 0.5%. Preferably less than 0.2%.

In accordance with an embodiment, the final solution formed is utilized to form an electron transport layer in an electroluminescence device such that the plurality of nanoparticles forms a bulge section on the electron transport layer.

In accordance with an embodiment, a density of the plurality of nanoparticles in the electron transport layer is less than 7 nanoparticles/$\mu m^2$, preferably between 1 and 5 nanoparticles per square micron, very preferably between 1 and 3 nanoparticles per square micron.

In accordance with an embodiment, the bulge section comprises a portion of the plurality of nanoparticles protruding out of the electron transport layer.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

References will now be made in detail to embodiments, examples of which are illustrated in the accompanying drawings.

Figure 1:
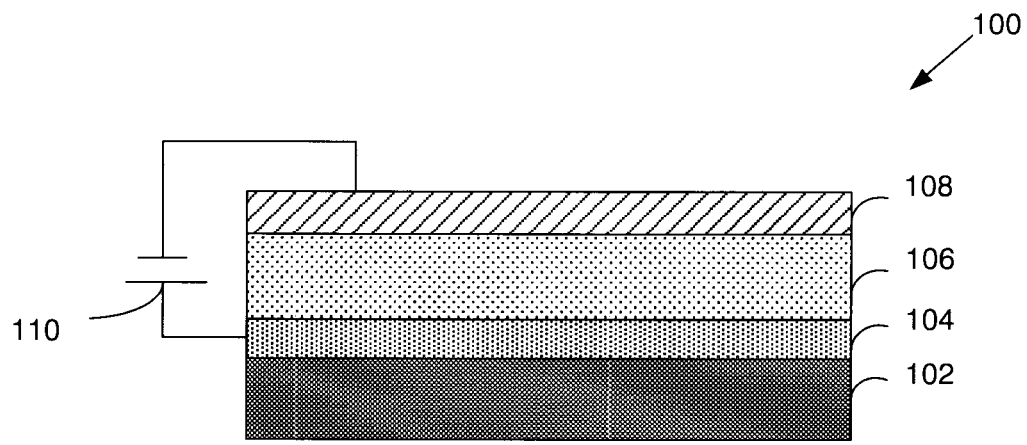
FIG. 1 is a schematic cross-sectional view of a conventional electroluminescence device.

FIG. 1 is a schematic cross-sectional view of a conventional electroluminescence device, such as an electroluminescence device 100. The electroluminescence device 100 includes a substrate 102, a first electrode 104, an organic layer 106, and a second electrode 108.

In the electroluminescence device 100, the first electrode 104 is disposed on the substrate 102. The first electrode is connected to a positive terminal of a voltage source 110. The organic layer 106 is disposed on the first electrode 104. Further, the second electrode 108 is disposed on the organic layer 106. Further, the second electrode 108 is connected to the negative terminal of the voltage source 110.

In an embodiment, the first electrode 104 may correspond to an anode of the electroluminescence device 100. Further, the first electrode 104 may be realized using transparent conductive materials such as indium tin oxide (ITO), indium zinc oxide (IZO) and indium gallium oxide (IGO). In an embodiment, the second electrode 108 may correspond to a cathode of the electroluminescence device 100. Further, the second electrode 108 may be realized using reflective materials such as silver (Ag) and sodium fluoride/magnesium/silver (Naf/Mg/Ag).

In operation, when a voltage signal is applied to the electroluminescence device 100 through the voltage source 110, the first electrode 104 injects holes in the organic layer 106. Further, on application of the voltage signal, the second electrode 108 injects electrons in the organic layer 106. The holes and electrons recombine in the organic layer 106 to generate excitons. When the excitons return to the ground state, they generate photons, which are emitted through the electroluminescence device 100 as light.

In an embodiment, the photons generated in the organic layer 106 are emitted out of the electroluminescence device 100 through the substrate 102, in a scenario where the electroluminescence device 100 is bottom emitting. In such a scenario, the photons may be reflected from the second electrode 108. A person having ordinary skill in the art will appreciate that not all the photons are reflected from the second electrode 108. Some of the photons are directly emitted out of the electroluminescence device 100 through the substrate.

Of the photons that are reflected from the second electrode 108, some photons cause the surface electrons of the second electrode 108 to oscillate, when the frequency of the photons (that are incident on the second electrode 108) matches with the natural frequency of the surface electrons of the second electrode 108. In such a process, the photons lose their energy. This may degrade the out coupling efficiency of the electroluminescence device 100. Such a phenomenon is commonly known as SPP.

To improve the out-coupling efficiency of the electroluminescence device 100, an organic layer of desired topography may be fabricated before the disposition of the second electrode 108. In an embodiment, the desired topography of the organic layer is achieved using one or more nanoparticles. Various embodiments of the topography of the organic layer are discussed in conjunction with FIGS. 2, 3, 4A, 4B, and 4C.

Figure 2:
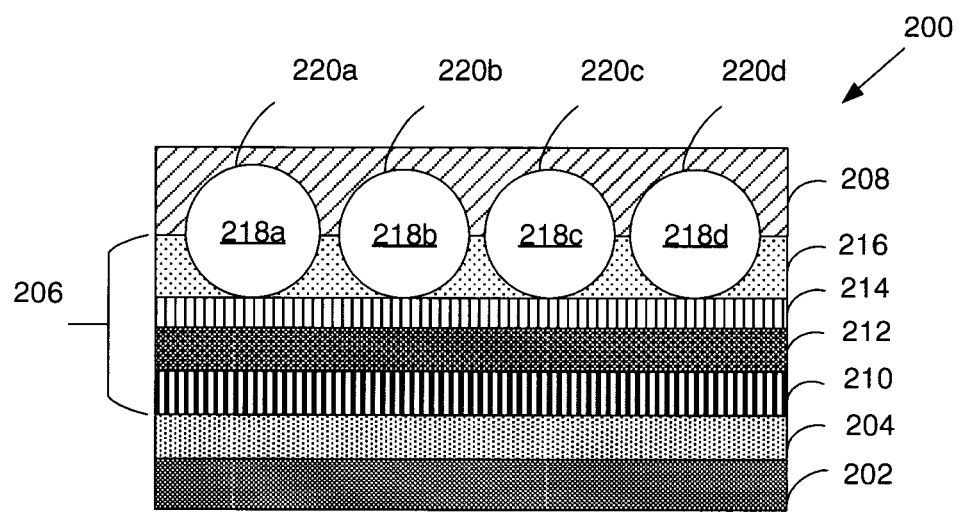
FIG. 2 is a schematic cross-sectional view of an electroluminescence device, in accordance with an embodiment of the present disclosure.

FIG. 2 is a schematic cross-sectional view of an electroluminescence device 200, in accordance with the present disclosure. The electroluminescence device 200 comprises a substrate 202, a first electrode 204, an organic layer 206, and a second electrode 208. The organic layer 206 further comprises a hole injection layer (HIL) 210, a hole transport layer (HTL) 212, an emissive layer (EL) 214, and an electron transport layer (ETL) 216. The ETL 216 includes one or more nanoparticles 218a, 218b, 218c, and 218d (hereinafter referred to as one or more nanoparticles 218) protruding out the ETL 216.

In an embodiment, the first electrode 204 injects holes towards the EL 214 through the HIL 210 and the HTL 212 that helps in better hole transportation towards the EL 214. Similarly, the second electrode 208 injects electrons towards the EL 214 through the ETL 216. The ETL 216, which includes the properties of an electron injection layer (EIL) (not shown in the FIG. 2) improves the electron transportation towards the EL 214. The holes and electrons recombine in the EL 214 to form excitons which emit light, via a photo emissive mechanism, when the excitons return from the excited state to the ground state.

For the forgoing disclosure, the electroluminescence device 200 is considered to be an OLED device. However, the scope of the disclosure should not be limited to the electroluminescence device 200 as an OLED device. In an embodiment, the electroluminescence device 200 may correspond to any other electronic devices that exhibit the electroluminescence phenomenon.

In the electroluminescence device 200, the substrate 202 may be realized by materials such as glass or laminate of flexible plastic or glass. In an embodiment, the first electrode 204 is disposed on the substrate 202. In an embodiment, the first electrode 204 corresponds to an anode of the electroluminescence device 200. In an embodiment, the first electrode 204 may be composed of transparent conducting materials such as, but not limited to, indium tin oxide (ITO), indium zinc oxide (IZO) and indium gallium oxide (IGO).

In an embodiment, after deposition of the first electrode 204 on the substrate 202, the HIL 210 is deposited on the first electrode 204. One or more known methodologies, such as spin coating, inkjet printing, screen printing and slot die coating, may be used to deposit the HIL 210 on the first electrode 204. In an embodiment, the HIL 210 may be realized by organic materials, such as optionally substituted, doped poly(ethylene dioxythiophene) (PEDT), in particular PEDT doped with a charge-balancing polyacid, such as polystyrene sulfonate (PSS), polyacrylic acid or a fluorinated sulfonic acid, for example Nafion®; polyaniline; and optionally substituted polythiophene or poly(thienothiophene).

Thereafter, in an embodiment, the HTL 212 is deposited on the HIL 210, using one or more known deposition techniques, such as spin coating, screen printing, slot die coating and inkjet printing. In an embodiment, the HTL 212 may be realized by hole-transporting polymer, which may be a homopolymer or copolymer comprising two or more different repeat units. The hole-transporting polymer may be conjugated or non-conjugated. Exemplary conjugated hole-transporting polymers are polymers comprising arylamine repeat units. Conjugated hole-transporting copolymers comprising arylamine repeat units may have one or more co-repeat units selected from arylene repeat units, for example one or more repeat units selected from fluorene, phenylene, phenanthrene naphthalene and anthracene repeat units, each of which may independently be unsubstituted or substituted with one or more substituents, optionally one or more C1-40 hydrocarbyl substituents.

Thereafter, in an embodiment, the EL 214 is deposited on the HTL 212 using the one or more known deposition techniques, such as spin coating, screen printing, slot die coating and inkjet printing. In an embodiment, the EL 214 may be realized by fluorescent materials, phosphorescent materials or a mixture of fluorescent and phosphorescent materials. Materials of the EL 214 may be selected from polymeric and non-polymeric light-emitting materials. Exemplary light-emitting polymers are conjugated polymers, for example polyphenylenes and polyfluorenes. The EL 214 may comprise a host material and a fluorescent or phosphorescent light-emitting dopant. Exemplary phosphorescent dopants are row 2 or row 3 transition metal complexes, for example complexes of ruthenium, rhodium, palladium, rhenium, osmium, iridium, platinum or gold.

After deposition of the EL 214 on the HTL 212, the ETL 216 is deposited on the EL 214 using a final solution based on various techniques, such as spin coating. In an embodiment, the final solution may be prepared by dispersing the one or more nanoparticles 218 in a solution, such that a weight percentage of the one or more nanoparticles 218 is less than 0.5% in the final solution. In an embodiment, the solution includes an electron transport layer material and a solvent. In an embodiment, the solvent may be selected to prevent the dissolution of the underlying layer (i.e. EL 214). The solvent may include a single polar solvent or a mixture of two or more polar solvents. Polar solvents may be protic or aprotic. Exemplary protic solvents are water and alcohols, for example methanol ethanol, propanol, butoxyethanol, ethylene glycol, 1-methoxy-2-propanol and monofluoro-, polyfluoro- or perfluoro-alcohols, optionally 2,2,3,3,4,4,5,5-octafluoro-1-pentanol. Exemplary aprotic polar solvents are dimethylsulfoxide; propylene carbonate; and 2-butanone. In an embodiment, the electron transport layer material may be selected from a group consisting of, but not limited to, MEH-PPV, PFO, P-PPV, oligoquinolines, conjugated polyelectrolyte poly[9,9-bis(3'-(N,N-dimethylamino)propyl)-2, 7-fluorene)-alt-2,7-(9,9-dioctylfluorene)], 4,7-diphenyl-1, 10-phenanthroline, 1,3,5-tri(3-pyrid-3-yl-phenylbenzene or diphenylphosphine oxide derivative.

In an embodiment, the density of the one or more nanoparticles 218 in the so formed ETL 216 is less than 7 nanoparticles/$\mu m^2$. Further, in an embodiment, the thickness of the so formed ETL 216 is in a range from 10 nm to 120 nm.

A person having ordinary skills in the art will appreciate that the scope of the disclosure is not limited to depositing the final solution on the EL 214 using spin coating technique. In an embodiment, the final solution can also be deposited using techniques, such as screen printing, a web coating, a slot die coating or an inkjet coating. A person having ordinary skills in the art will further appreciate that the solvent in the final solution (deposited on the EL 214) evaporates, and the left over material forms the ETL 216.

In an embodiment, the thickness of the ETL 216 is less than the diameter of each of the one or more nanoparticles 218. Therefore, one or more bulge sections 220*a*, 220*b*, 220*c* and 220*d* (hereinafter referred to as the one or more bulge sections 220) are created on the surface of the ETL 216. The structure of the one or more bulge sections 220 has been described later in conjunction with FIG. 3. In an embodiment, various topographies of the ETL 216 may be achieved by varying the diameter of the one or more nanoparticles 218 and/or varying the thickness of the ETL 216.

In an embodiment, the material of the one or more nanoparticles 218 may be selected from a group consisting of, but not limiting to, silicon oxide and polystyrene. In an embodiment, the one or more nanoparticles 218 may correspond to negatively charged silicon oxide nanoparticles. Further, the one or more nanoparticles 218 are optically transparent and electrically insulating.

In an embodiment, the one or more nanoparticles 218 may be fabricated by adding tetraethyl orthosilicate to a mixture of ammonium hydroxide, ethanol, and water. In an embodiment, the one or more nanoparticles 218 are fabricated in such a manner that a diameter of each of the one or more nanoparticles 218 is in a range from 60 nm to 150 nm. A person having ordinary skill in the art will appreciate that the scope of the disclosure is not limited to fabricating the one or more nanoparticles 218 using the method described supra. In an embodiment, any known method may be utilized to fabricate the one or more nanoparticles 218.

After the ETL 216 is disposed on the EL 214, the second electrode 208 is disposed on at least the one or more bulge sections 220. As the second electrode 208 is deposited on the one or more bulge sections 220, the surface area of the second electrode 208 in direct contact with the ETL 216 is reduced in comparison with the surface area of the second electrode 108 in the contact with the organic layer 106 in the conventional electroluminescence device 100. In an embodiment, the reduction in the surface area of the second electrode 208 in contact with the ETL 216 results in less interaction of the photons with the surface electrons of the second electrode 208. Therefore, the SPP formations in the electroluminescence device 200 are reduced in comparison with the SPP formations in the conventional electroluminescence device 100. Hence, electroluminescence device 200 exhibits increased out-coupling efficiency.

In an embodiment, the SPP wave while interacting with one or more nanoparticles 218 gets polarized and induces dipole. For the surface area of the ETL 216 including one or more nanoparticles 218, the distance between the SPP-induced dipole created at the ETL/cathode interface and second electrode 208 i.e. metallic cathode increases, resulting in reduction of SPP coupling at the metal-organic interface. Thus the out-coupling efficiency increases.

A person having ordinary skill in the art will understand that the HIL 210, HTL 212, EL 214, and ETL 216, can also be considered as a single composite organic layer 206 of the electroluminescence device 200 disposed between the first electrode 204 and the second electrode 208.

For the purpose on ongoing description, the HIL 210, HTL 212, EL 214, and ETL 216, have been considered as a single composite organic layer 206. Various topographies of the organic layer 206 have been described later in conjunction with FIGS. 4A, 4B, and 4C.

The FIG. 2 illustrates four nanoparticles in the ETL 216. However scope of the disclosure is not limited to having four nanoparticles. In an embodiment, the number of one or more nanoparticles 218 in the ETL 216 may vary based on the density of the one or more nanoparticles 218 in the ETL 216. Further, the person having ordinary skill in the art would understand that scope of the disclosure is not limited to spherical shaped nanoparticles (as shown in the FIG. 2). In an embodiment, the one or more nanoparticles can have any other geometrical shape.

Figure 3:
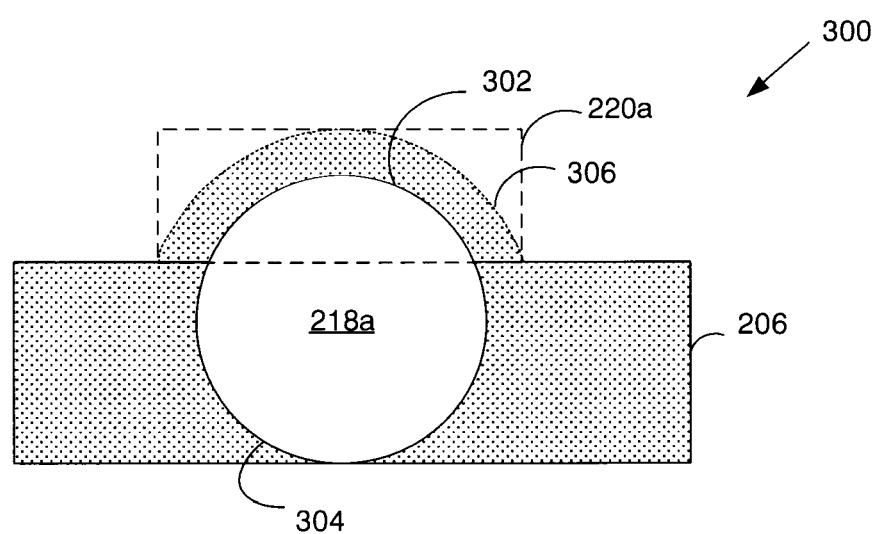
FIG. 3 is a schematic cross-sectional view of a bulge section created on an organic layer, in accordance with an embodiment of the present disclosure

FIG. 3 illustrates a schematic cross-sectional view 300 of the bulge section 220a created on the organic layer 206, in accordance with an embodiment of the present disclosure. FIG. 3 is described in conjunction with FIG. 2.

In an embodiment the nanoparticle 218a protruding out the organic layer 206 has a first portion 302 and a second portion 304. The first portion 302 extends out from the organic layer 206 and the second portion 304 is inside the organic layer 206. The bulge section 220a is created due to the first portion 302 that extends out of the organic layer 206. In an embodiment, the height of the bulge section 220a is in a range from 50 nm to 200 nm.

As discussed supra, the organic layer 206 is created after evaporation of the solvent in the final solution. As the final solution includes the one or more nanoparticles 218, therefore after the evaporation of the solvent, the organic material may be left over on the one or more nanoparticles 218 (depicted by 306).

Figure 4A:
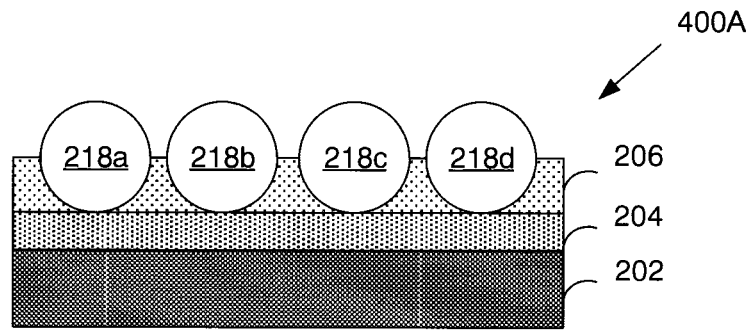
FIG. 4A is a surface topography of an organic layer in an electroluminescence device, in accordance with an embodiment of the present disclosure.

FIG. 4A illustrates a surface topography 400A of the organic layer 206 of an electroluminescence device 200, in accordance with the present disclosure. The surface topography 400A is described in conjunction with FIG. 2.

In an embodiment, from FIG. 4A, it can be observed that the thickness of the organic layer 206 is less than the diameter of the one or more nanoparticles 218. Further, the height of the first portion 302 of the one or more nanoparticles 218 that extends out of the organic layer 206 to create the one or more bulge sections 220 is greater than the depth of the second portion 304 of the one or more nanoparticles 218 inside the organic layer 206. As discussed supra, the first portion 302 of the one or more nanoparticles 218 may be completely or partially covered by the organic material.

Figure 4B:
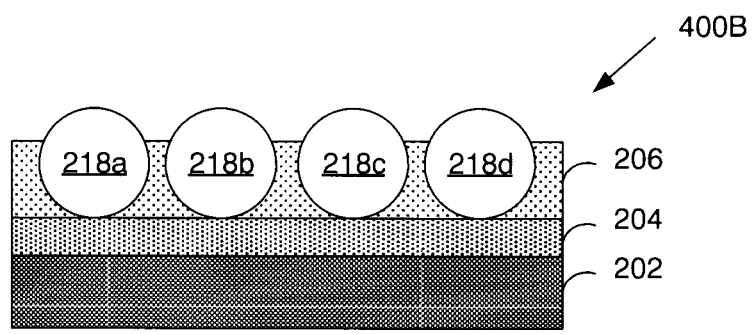
FIG. 4B is another surface topography of an organic layer in an electroluminescence device, in accordance with an embodiment of the present disclosure.

FIG. 4B illustrates a surface topography 400B of the organic layer 206 of an electroluminescence device 200, in accordance with the present disclosure. The surface topography 400B is described in conjunction with FIG. 2 and FIG. 3.

In an embodiment, from FIG. 4B, it can be observed that the thickness of the organic layer 206 is less than the diameter of the one or more nanoparticles 218. Further, the height of the first portion 302 of the one or more nanoparticles 218 that extends out of the organic layer 206 to create the one or more bulge sections 220 is less than the depth of the second portion 304 of the one or more nanoparticles 218 inside the organic layer 206.

Figure 4C:
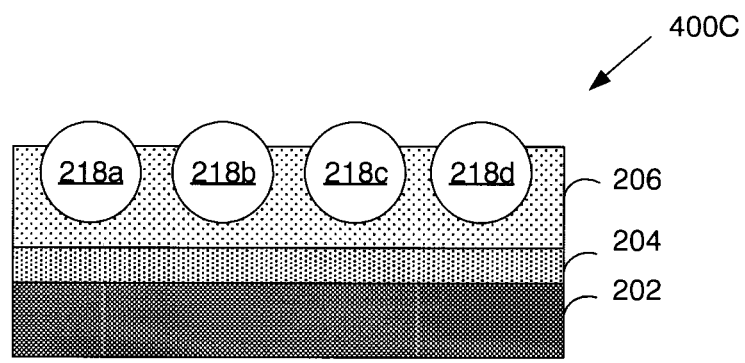
FIG. 4C is yet another surface topography of an organic layer in an electroluminescence device, in accordance with an embodiment of the present disclosure.

FIG. 4C illustrates a surface topography 400C of the organic layer 206 of an electroluminescence device 200, in accordance with the present disclosure. The surface topography 400C is described in conjunction with FIG. 2.

In an embodiment, from FIG. 4C, it can be observed that the thickness of the organic layer 206 is greater than the diameter of the one or more nanoparticles 218. In such a scenario, the one or more nanoparticles 218 are phase separated to the top of the organic layer 206. As discussed above, the one or more nanoparticles 218 extend out of the organic layer 206 to create the one or more bulge sections 220.

The nanoparticles used in the above embodiments are preferably spherical or approximately spherical.

The structures and composition for the electroluminescence device 200, in accordance with the present disclosure, have reduced the SPP formations at the interface of the organic layer and the cathode, resulting in considerable enhancement in luminous efficiency and external quantum efficiency of the electroluminescence device 200 with suitable control of parameters such as concentration of nanoparticle with respect to the concentration of organic material, diameter of nanoparticles and thickness of the organic layer.

Although the present invention has been described in terms of specific exemplary embodiments, it will be appreciated that various modifications, alterations and/or combinations of features disclosed herein will be apparent to those skilled in the art without departing from the scope of the invention as set forth in the following claims

The invention claimed is:

1. An electroluminescence device comprising:
   a substrate;
   a first electrode disposed on the substrate;
   a second electrode;
   an organic layer disposed between the first electrode and the second electrode, wherein the organic layer comprises an electron transport layer;
   wherein the electron transport layer is formed by depositing a final solution comprising a dispersion of nanoparticles in a solution comprising an electron transport layer material and a solvent, followed by evaporation of the solvent such that the formed electron transport layer comprises a density of the nanoparticles in the electron transport layer which is less than 7 nanoparticles/$\mu m^2$,
   wherein each of the nanoparticles protrudes out of the electron transport layer and is completely or partially covered by the electron transport layer material to form a bulge section on the electron transport layer, and wherein the second electrode is disposed on at least the bulge section, and wherein a diameter of the nanoparticles is greater than a thickness of the electron transport layer.

2. The electroluminescence device of claim 1, wherein the organic layer disposed between the first electrode and the second electrode corresponds to the electron transport layer.

3. The electroluminescence device of claim 1, wherein the organic layer disposed between the first electrode and the second electrode comprises a hole injection layer, a hole transport layer, an emissive layer and the electron transport layer.

4. The electroluminescence device of claim 1, wherein the final solution is deposited on the first electrode to form the electron transport layer using at least one of a spin coating technique, a screen printing technique, a web coating technique or an inkjet coating technique.

5. The electroluminescence device of claim 1, wherein a weight percentage of the one or more nanoparticles is less than 0.5% in the final solution.

6. The electroluminescence device of claim 1, wherein a diameter of each of the one or more nanoparticles is in a range from 60 nm to 150 nm.

7. The electroluminescence device of claim 1, wherein a thickness of the organic layer is in a range from 10 nm to 120 nm.

8. The electroluminescence device of claim 1, wherein a height of the bulge section on the organic layer is in a range from 50 nm to 200 nm.

9. The electroluminescence device of claim 1, wherein each of the one or more nanoparticles are optically transparent and electrically insulating.

10. The electroluminescence device of claim 1, wherein a material of the organic layer is selected from a group consisting of: MEH-PPV, PFO, P-PPV, Oligoquinolines, conjugated polyelectrolyte poly[9,9-bis(3'-(N,N-dimethylamino)propyl)-2,7-fluorene)-alt-2,7-(9,9-dioctylfluorene)], 4,7-diphenyl-1,10-phenanthroline, 1,3,5-tri(3-pyrid-3-yl-phenyl)benzene and diphenylphosphine oxide derivatives.

11. The electroluminescence device of claim 1, wherein the first electrode disposed on the substrate corresponds to an anode and wherein the second electrode disposed on at least the bulge section corresponds to a cathode.

12. The electroluminescence device of claim 1, wherein the substrate corresponds to a transparent substrate.

13. A process of manufacturing the electroluminescence device according to claim 1, wherein the process comprises dispersing the one or more nanoparticles in a first solution comprising an organic material and a solvent to form a final solution and depositing the final solution on the first electrode to form the organic layer.

14. A composition of an electron transport layer of an electroluminescence device, comprising;
  a solvent;
  an electron transport layer material dissolved in the solvent to form a solution;
  a plurality of nanoparticles dispersed in the solution to form a final solution,
    wherein a weight percentage of the plurality of nanoparticles in the final solution is less than 0.5%, and
    wherein the final solution is deposited and the solvent is evaporated to form the electron transport layer in the electroluminescence device, such that the formed electron transport layer comprises a density of the one or more nanoparticles in the electron transport layer which is less than 7 nanoparticles/$\mu m^2$, wherein each one of the nanoparticles protrudes out of the electron transport layer and is completely or partially covered by the electron transport layer material to form a bulge section on the electron transport layer, and a diameter of the nanoparticles is greater than a thickness of the electron transport layer.

* * * * *